United States Patent
Le et al.

(10) Patent No.: US 10,311,901 B1
(45) Date of Patent: Jun. 4, 2019

(54) ANISOTROPY FIELD INDUCED SELF PINNED RECESSED ANTIFERROMAGNETIC READER

(71) Applicant: Western Digital Technologies, Inc., San Jose, CA (US)

(72) Inventors: Quang Le, San Jose, CA (US); Hongquan Jiang, San Jose, CA (US); Yongchul Ahn, San Jose, CA (US); Alexander M. Zeltser, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/992,488

(22) Filed: May 30, 2018

(51) Int. Cl.
  *G11B 5/40* (2006.01)
  *G11B 5/39* (2006.01)
  (Continued)

(52) U.S. Cl.
  CPC ............ *G11B 5/398* (2013.01); *G01R 33/093* (2013.01); *G11B 5/11* (2013.01); *G11B 5/187* (2013.01);
  (Continued)

(58) Field of Classification Search
  None
  See application file for complete search history.

(56) References Cited

U.S. PATENT DOCUMENTS

| 6,381,094 B1 * | 4/2002 | Gill | B82Y 10/00 |
| | | | 360/125.3 |
| 6,760,191 B1 * | 7/2004 | Yan | G11B 5/10 |
| | | | 360/128 |

(Continued)

FOREIGN PATENT DOCUMENTS

| JP | 2000353308 A | * 12/2000 | ........... G11B 5/3136 |
| JP | 2008098557 A | * 4/2008 | |
| KR | 20040107346 A | * 12/2004 | ............ B82Y 10/00 |

OTHER PUBLICATIONS

Han, et al.; AIP Journal of Applied Physics; Control of Offset Field and Pinning Stability in Perpendicular Magnetic Tunnelling Junctions with Synthetic Antiferromagnetic Coupling Multilayer; dated Mar. 9, 2015; 5 total pages.

*Primary Examiner* — William J Klimowicz
(74) *Attorney, Agent, or Firm* — Patterson & Sheridan, LLP; Steven Versteeg

(57) ABSTRACT

The present disclosure generally relates to data storage devices, and more specifically, to a magnetic media drive employing a magnetic read head. The magnetic read head includes an antiferromagnetic layer recessed from the MFS, a reference layer disposed over the antiferromagnetic layer, a free layer disposed over the reference layer, and a thermally conductive structure disposed over the reference layer. The thermally conductive structure is recessed from the MFS. The thermally conductive structure includes a first portion and a second portion. The first portion of the thermally conductive structure extends from the second portion of the thermally conductive structure towards the (Continued)

MFS. The first portion of the thermally conductive structure is aligned with the free layer in a stripe height direction. With the thermally conductive structure, thermal stabilization of the read head is achieved.

30 Claims, 5 Drawing Sheets

(51) Int. Cl.
  *G01R 33/09* (2006.01)
  *G11B 5/187* (2006.01)
  *G11B 5/11* (2006.01)
  *G11B 5/31* (2006.01)

(52) U.S. Cl.
  CPC .......... *G11B 5/314* (2013.01); *G11B 5/3929* (2013.01); *G11B 5/40* (2013.01)

(56) References Cited

U.S. PATENT DOCUMENTS

| | | | | |
|---|---|---|---|---|
| 7,365,949 B2* | 4/2008 | Hayakawa | ............... | G11B 5/39 360/324.1 |
| 7,436,637 B2* | 10/2008 | Pinarbasi | ............... | B82Y 10/00 360/324.11 |
| 7,466,523 B1* | 12/2008 | Chen | ............... | B82Y 10/00 360/324.1 |
| 7,522,391 B2 | 4/2009 | Freitag et al. | | |
| 8,582,249 B2* | 11/2013 | Sapozhnikov | ....... | G01R 33/093 360/324.11 |
| 8,675,318 B1* | 3/2014 | Ho | ............... | G11B 5/398 360/324.11 |
| 8,711,528 B1* | 4/2014 | Xiao | ............... | G11B 5/3909 360/122 |
| 8,842,395 B2* | 9/2014 | Ju | ............... | G11B 5/3906 360/324.12 |
| 9,030,785 B2 | 5/2015 | Freitag et al. | | |
| 9,042,062 B2 | 5/2015 | Hong et al. | | |
| 9,171,559 B1 | 10/2015 | Nikolaev et al. | | |
| 9,269,382 B1* | 2/2016 | Bertero | ............... | G11B 5/3929 |
| 9,514,771 B2* | 12/2016 | Makino | ............... | G11B 5/3912 |
| 9,653,102 B1* | 5/2017 | Kief | ............... | G11B 5/3912 |
| 9,679,589 B2 | 6/2017 | Hassan et al. | | |
| 2001/0043446 A1* | 11/2001 | Barlow | ............... | G11B 5/3136 360/319 |
| 2002/0093772 A1* | 7/2002 | Yoshida | ............... | G11B 5/3106 360/317 |
| 2002/0186515 A1* | 12/2002 | Gill | ............... | B82Y 10/00 360/324.2 |
| 2004/0027717 A1* | 2/2004 | Alfoqaha | ............... | B82Y 10/00 360/125.75 |
| 2004/0027719 A1* | 2/2004 | Gider | ............... | G11B 5/105 360/128 |
| 2004/0207960 A1* | 10/2004 | Saito | ............... | G11B 5/3903 360/324.1 |
| 2004/0207962 A1* | 10/2004 | Saito | ............... | B82Y 10/00 360/324.11 |
| 2005/0174703 A1 | 8/2005 | Gill | | |
| 2005/0237676 A1 | 10/2005 | Gill | | |
| 2005/0286178 A1* | 12/2005 | Gill | ............... | B82Y 10/00 360/324.2 |
| 2009/0086385 A1* | 4/2009 | Gill | ............... | B82Y 10/00 360/324.11 |
| 2015/0179195 A1* | 6/2015 | Freitag | ............... | G11B 5/3932 360/75 |
| 2015/0248907 A1 | 9/2015 | Freitag et al. | | |

\* cited by examiner

ANISOTROPY FIELD INDUCED SELF PINNED RECESSED ANTIFERROMAGNETIC READER

BACKGROUND OF THE DISCLOSURE

Field of the Disclosure

Embodiments of the present disclosure generally relate to data storage devices, and more specifically, to a magnetic media drive employing a magnetic read head.

Description of the Related Art

The heart of a computer is a magnetic media drive which typically includes a rotating magnetic medium, such as a disk, a slider that has read and write heads, a suspension arm above the rotating disk, and an actuator arm that swings the suspension arm to place the read and/or write heads over selected tracks on the rotating disk. The read head typically utilizes a spin valve sensor, also referred to as a giant magnetoresistive (GMR) sensor. The sensor at a media facing surface (MFS) typically includes a barrier layer sandwiched between a reference layer and a free layer, and an antiferromagnetic (AFM) layer for pinning the magnetization of the reference layer. The magnetization of the reference layer is pinned perpendicular to the MFS and the magnetic moment of the free layer is located parallel to the MFS, but free to rotate in response to external magnetic fields.

The need for ever increased data density is pushing researchers to develop data recording systems that can read and record ever smaller bit lengths in order to increase the density of data recorded on a magnetic medium. This has led to a push to decrease the gap thickness of a read head such as a GMR head. However, the amount by which such gap thickness can be decreased has been limited by physical limitations of sensors and also by the limitations of currently available manufacturing methods.

A self-pinned sensor in which the antiferromagnetic layer is recessed from the MFS can be a path to achieving smaller read gap and higher resolution. However, the recessed antiferromagnetic layer has a reduced antiferromagnetic pinning strength to the reference layer, which could negatively affect the stability of the read head.

Therefore, there is a need for an improved magnetic read head.

SUMMARY OF THE DISCLOSURE

The present disclosure generally relates to data storage devices, and more specifically, to a magnetic media drive employing a magnetic read head. The magnetic read head includes an antiferromagnetic layer recessed from the MFS, a reference layer disposed over the antiferromagnetic layer, a free layer disposed over the reference layer, and a thermally conductive structure disposed over the reference layer. The thermally conductive structure is recessed from the MFS. The thermally conductive structure includes a first portion and a second portion. The first portion of the thermally conductive structure extends from the second portion of the thermally conductive structure towards the MFS. The first portion of the thermally conductive structure is aligned with the free layer in a stripe height direction. With the thermally conductive structure, thermal stabilization of the read head is achieved.

In one embodiment, a magnetic read head includes an antiferromagnetic layer recessed from a media facing surface, a reference layer disposed over the antiferromagnetic layer, a free layer disposed over the reference layer, and a thermally conductive structure recessed from the media facing surface. The thermally conductive structure includes a first portion and a second portion, the first portion extending from the second portion towards the media facing surface, and the first portion is aligned with the free layer in a stripe height direction.

In another embodiment, a magnetic read head includes an antiferromagnetic layer recessed from a media facing surface, a reference layer disposed over the antiferromagnetic layer, a free layer disposed over the reference layer, and a thermally conductive structure recessed from the media facing surface. The thermally conductive structure includes a first portion and a second portion, the first portion extending from the second portion towards the media facing surface, and the first portion has a first width, the second portion has a second width, and the second width is substantially greater than the first width.

In another embodiment, a magnetic read head includes an antiferromagnetic layer recessed from a media facing surface, and the antiferromagnetic layer includes a first portion, a second portion, a third portion, and a fourth portion. The third portion is between the first portion and the second portion. The magnetic read head further includes a reference layer disposed over the antiferromagnetic layer, a free layer disposed over the reference layer, and a thermally conductive structure recessed from the media facing surface. The thermally conductive structure includes a first portion and a second portion, the first portion extending from the second portion towards the media facing surface, the first portion of the thermally conductive structure is aligned with the third portion of the antiferromagnetic layer in a down-track direction, and the second portion of the thermally conductive structure is aligned with the fourth portion of the antiferromagnetic layer in the down-track direction.

In another embodiment, a magnetic read head includes an antiferromagnetic layer recessed from a media facing surface, and a high Hk insertion layer disposed on the antiferromagnetic layer. The high Hk insertion layer includes a first portion having a first width and a second portion having a second width substantially greater than the first width, and the first portion extends from the second portion to the media facing surface. The magnetic recording head further includes a reference layer disposed over the high Hk insertion layer, a free layer disposed over the reference layer, and a thermally conductive structure recessed from the media facing surface. The thermally conductive structure includes a first portion and a second portion, the first portion extending from the second portion towards the media facing surface, and the first portion of the thermally conductive structure is aligned with the first portion of the high Hk insertion layer in a down-track direction.

In another embodiment, a magnetic read head includes an antiferromagnetic layer recessed from a media facing surface, a reference layer disposed over the antiferromagnetic layer, a free layer disposed over the reference layer, and means for dissipating heat disposed on the reference layer. The means for dissipating heat includes a first portion and a second portion, the first portion extending from the second portion towards the media facing surface, and the first portion is aligned with the free layer in a stripe height direction.

BRIEF DESCRIPTION OF THE DRAWINGS

So that the manner in which the above recited features of the present disclosure can be understood in detail, a more particular description of the disclosure, briefly summarized above, may be made by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to data storage devices, and more specifically, to a magnetic media drive employing a magnetic read head. The magnetic read head includes an antiferromagnetic layer recessed from the MFS, a reference layer disposed over the antiferromagnetic layer, a free layer disposed over the reference layer, and a thermally conductive structure disposed over the reference layer. The thermally conductive structure is recessed from the MFS. The thermally conductive structure includes a first portion and a second portion. The first portion of the thermally conductive structure extends from the second portion of the thermally conductive structure towards the MFS. The first portion of the thermally conductive structure is aligned with the free layer in a stripe height direction. With the thermally conductive structure, thermal stabilization of the read head is achieved.

The terms "over," "under," "between," and "on" as used herein refer to a relative position of one layer with respect to other layers. As such, for example, one layer disposed over or under another layer may be directly in contact with the other layer or may have one or more intervening layers. Moreover, one layer disposed between layers may be directly in contact with the two layers or may have one or more intervening layers. In contrast, a first layer "on" a second layer is in contact with the second layer. Additionally, the relative position of one layer with respect to other layers is provided assuming operations are performed relative to a substrate without consideration of the absolute orientation of the substrate.

Figure 1:
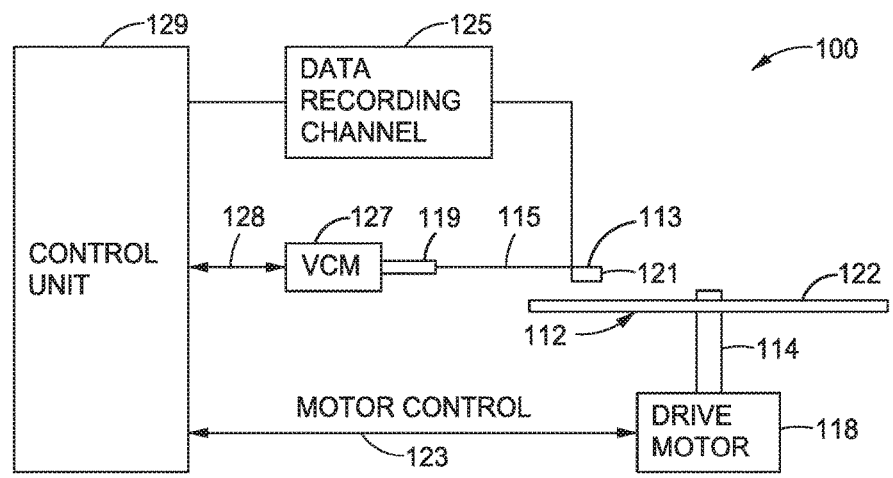
FIG. 1 is a schematic illustration of a magnetic media device according to one embodiment.

FIG. 1 is a schematic illustration of a data storage device such as a magnetic media device. Such a data storage device may be a single drive/device or comprise multiple drives/devices. For the sake of illustration, a single disk drive 100 is shown according to one embodiment. As shown, at least one rotatable magnetic disk 112 is supported on a spindle 114 and rotated by a drive motor 118. The magnetic recording on each magnetic disk 112 is in the form of any suitable patterns of data tracks, such as annular patterns of concentric data tracks (not shown) on the magnetic disk 112.

At least one slider 113 is positioned near the magnetic disk 112, each slider 113 supporting one or more magnetic head assemblies 121 that may include a "T" shaped thermally conductive structure for increasing thermal stability of a magnetic read head. As the magnetic disk 112 rotates, the slider 113 moves radially in and out over the disk surface 122 so that the magnetic head assembly 121 may access different tracks of the magnetic disk 112 where desired data are written. Each slider 113 is attached to an actuator arm 119 by way of a suspension 115. The suspension 115 provides a slight spring force which biases the slider 113 toward the disk surface 122. Each actuator arm 119 is attached to an actuator means 127. The actuator means 127 as shown in FIG. 1 may be a voice coil motor (VCM). The VCM includes a coil movable within a fixed magnetic field, the direction and speed of the coil movements being controlled by the motor current signals supplied by control unit 129.

During operation of the disk drive 100, the rotation of the magnetic disk 112 generates an air bearing between the slider 113 and the disk surface 122 which exerts an upward force or lift on the slider 113. The air bearing thus counterbalances the slight spring force of suspension 115 and supports slider 113 off and slightly above the disk surface 122 by a small, substantially constant spacing during normal operation.

The various components of the disk drive 100 are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads on the assembly 121 by way of recording channel 125.

The above description of a typical magnetic media device and the accompanying illustration of FIG. 1 are for representation purposes only. It should be apparent that magnetic media devices may contain a large number of media, or disks, and actuators, and each actuator may support a number of sliders.

Figure 2:
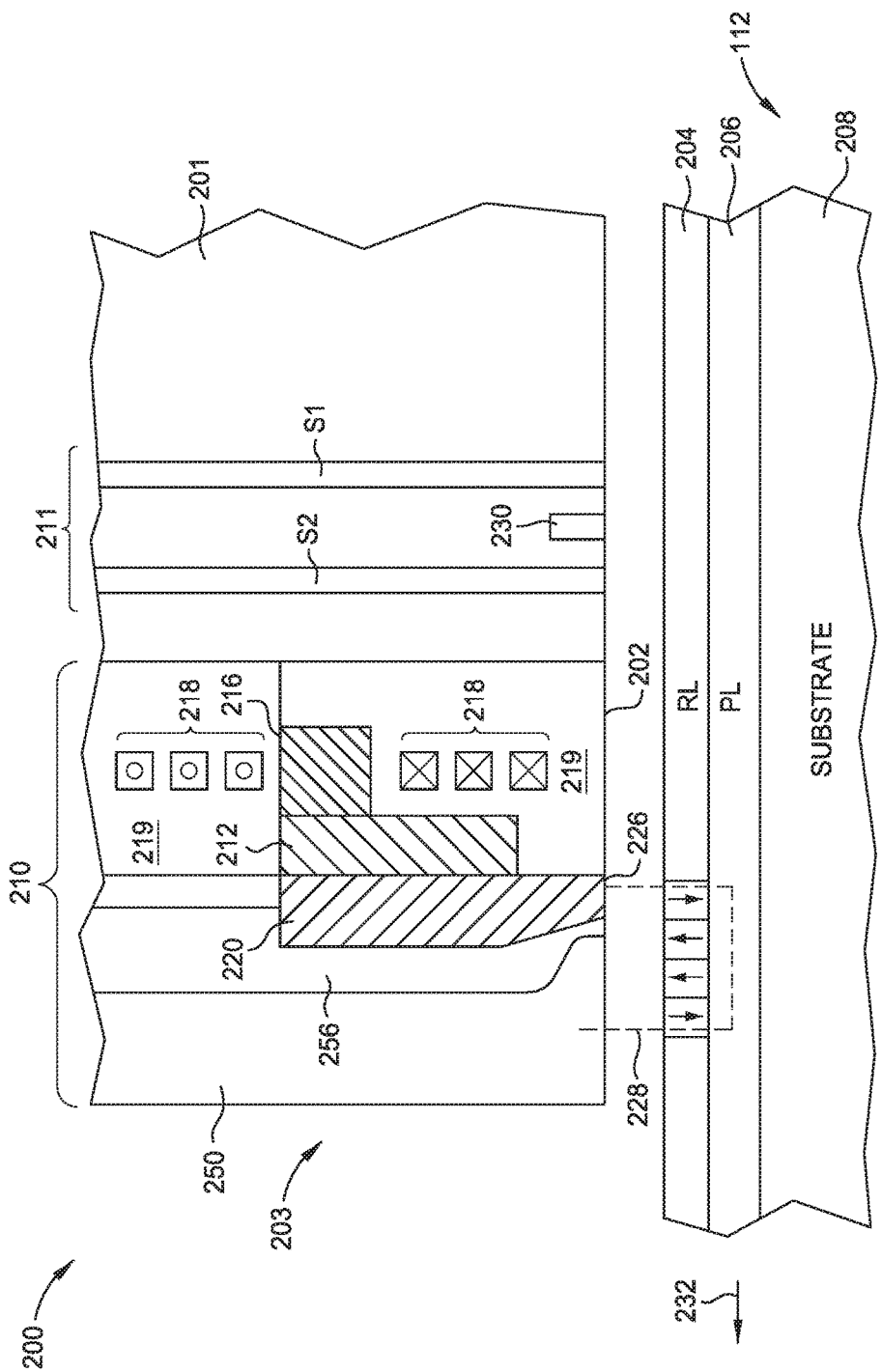
FIG. 2 is a fragmented, cross sectional side view of a read/write head facing a magnetic disk according to one embodiment.

FIG. 2 is a fragmented, cross sectional side view of a read/write head 200 mounted on a slider 201 and facing the magnetic disk 112. The slider 201 may be the slider 113 in FIG. 1. In some embodiments, the magnetic disk 112 may be a "dual-layer" disk that includes a perpendicular magnetic data recording layer (RL) 204 on a "soft" or relatively low-coercivity magnetically permeable underlayer (PL) 206 formed on a disk substrate 208. The read/write head 200 includes a MFS 202, a magnetic write head 210 and a magnetic read head 211, and is mounted such that the MFS 202 is facing the magnetic disk 112. In FIG. 2, the magnetic disk 112 moves past the write head 210 in the direction indicated by the arrow 232, so the portion of the read/write head 200 that is opposite the slider 201 is often called the "trailing" end 203.

The magnetic read head 211 includes a sensing element 230 located between sensor shields S1 and S2. The sensor shields S1 and S2 may be fabricated from a ferromagnetic material, such as NiFe, NiFeCr, NiFeMo, NiFeCu, NiFeCo, NiCo, CoFe or combinations thereof. The RL 204 is illustrated with perpendicularly recorded or magnetized regions, with adjacent regions having magnetization directions, as represented by the arrows located in the RL 204. The magnetic fields of the adjacent magnetized regions are detectable by the sensing element 230 as the recorded bits.

The write head 210 includes a magnetic circuit made up of a main pole 212 and a yoke 216. The write head 210 also includes a thin film coil 218 shown in the section embedded in non-magnetic material 219 and wrapped around yoke 216. In an alternative embodiment, the yoke 216 may be omitted, and the coil 218 may wrap around the main pole 212. A write pole 220 is magnetically connected to the main pole 212 and has an end 226 that defines part of the MFS 202 of the magnetic write head 210 facing the magnetic disk 112.

In operation, write current passes through the coil 218 and induces a magnetic field (shown by dashed line 228) from the write pole 220 that passes through the RL 204 (to magnetize the region of the RL 204 beneath the write pole 220), through the flux return path provided by the PL 206, and back to an upper return pole 250. In one embodiment, the greater the magnetic flux of the write pole 220, the greater is the probability of accurately writing to specified regions of the RL 204.

FIG. 2 further illustrates one embodiment of the upper return pole 250 that is separated from write pole 220 by a non-magnetic gap layer 256. The upper return pole 250 is formed of magnetically permeable material (such as Ni, Co and Fe alloys) and the gap layer 256 is formed of non-magnetic material (such as Ta, TaO, Ru, Rh, NiCr, SiC or AlO). In some embodiments, the upper return pole 250 may be a trailing shield. Alternatively, in some embodiments, the upper return pole 250 may be a wrap-around shield wherein the shield covers the trailing end 203 and also wraps around the sides of the write pole 220. As FIG. 2 is a cross section through the center of the read/write head 200, it represents both trailing and wrap-around embodiments.

Figure 3:
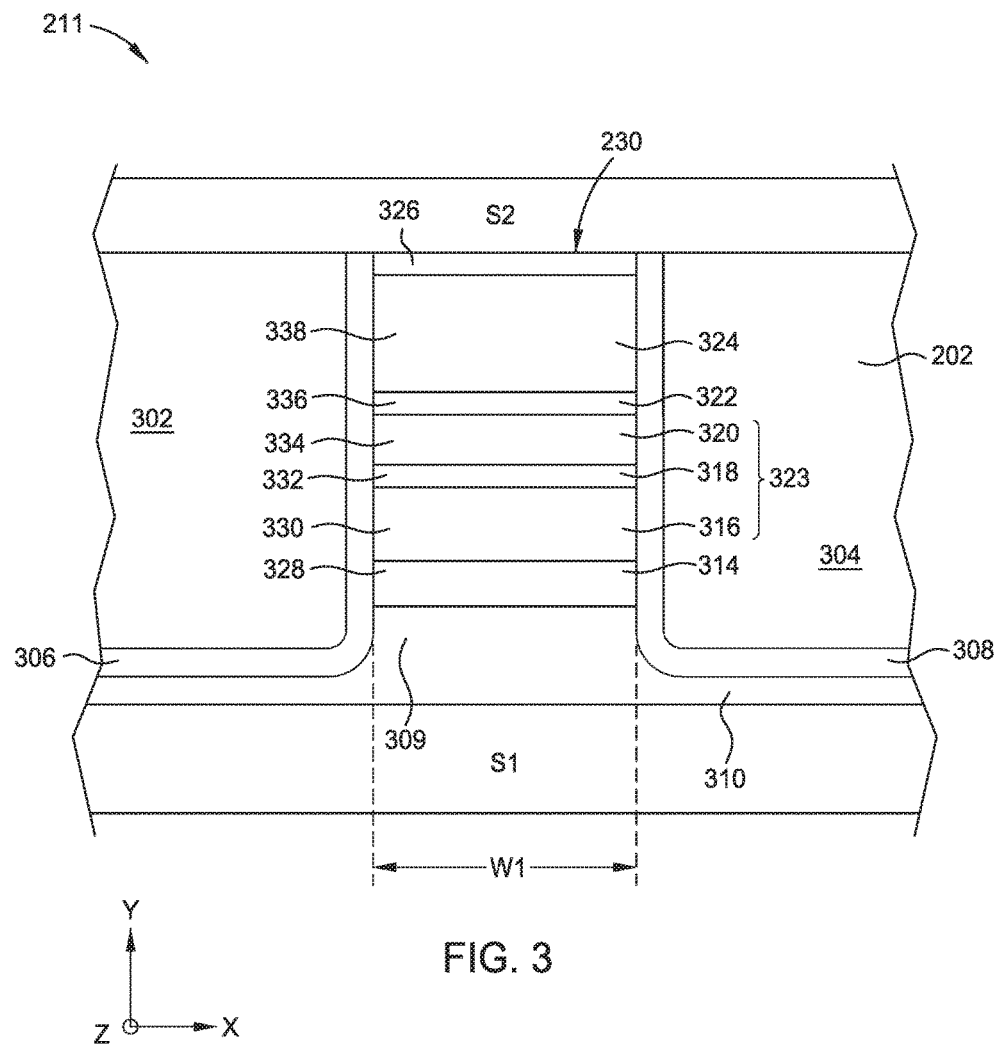
FIG. 3 is a MFS view of a portion of a magnetic read head of FIG. 2 according to one embodiment.

FIG. 3 is a MFS view of a portion of the magnetic read head 211 of FIG. 2 according to one embodiment. The magnetic read head 211 includes the sensing element 230 disposed between the sensor shields S1 and S2 in the down-track direction, as indicated by the Y-axis. The magnetic read head 211 further includes a first side shield 302 and a second side shield 304, and the sensing element 230 is disposed between the first side shield 302 and the second side shield 304 in the cross-track direction, as indicated by the X-axis. In one embodiment, each of the first and second side shields 302, 304 is fabricated from a magnetic material, such as NiFe. In another embodiment, each of the first and second side shields 302, 304 is a multi-layer structure, such as a synthetic antiferromagnetic (SAF) structure. The first side shield 302 is separated from the sensor shields S1, S2 and the sensing element 230 by a first insulating layer 306, and the second side shield 304 is separated from the sensor shields S1, S2 and the sensing element 230 by a second insulating layer 308. Each of the first and second insulating layers 306, 308 is fabricated from silicon nitride, alumina, or magnesium oxide.

The magnetic read head 211 further includes a shield structure 310 disposed on the sensor shield S1. The shield structure 310 may be fabricated from the same material as the sensor shield S1. The shield structure 310 is disposed between the insulating layers 306, 308 and the sensor shield S1, and a portion 309 of the shield structure 310 is disposed between the sensor shield S1 and the sensing element 230. The sensing element 230 is disposed on the shield structure 310. A high anisotropy field (Hk) insertion layer 314 is disposed on the shield structure 310. The thickness of the high Hk insertion layer 314 ranges from about 50 Angstroms to about 500 Angstroms. The high Hk insertion layer 314 may be fabricated from a magnetic material, such as FeCo, NiFe, FeNiCo, NiFeCr, Co, CoFeB, or the combination thereof.

A reference layer 323 is disposed on the high Hk insertion layer 314. In one embodiment, the reference layer 323 is an antiparallel (AP) pinned structure, as shown in FIG. 3. The reference layer 323 includes a first ferromagnetic (AP1) layer 316 and a second ferromagnetic (AP2) layer 320 that are anti-ferromagnetically coupled across an AP coupling (APC) layer 318. Each of the AP1 layer 316 and the AP2 layer 320 is fabricated from a magnetic material, such as Co, CoFe, CoFeB, CoHf, or combinations thereof. The APC layer 318 is fabricated from Ru, Ir, Rh, Cr, or alloys thereof. Due to the antiparallel coupling across the APC layer 318, the AP1 layer 316 and the AP2 layer 320 have respective magnetizations oriented antiparallel to each other.

A non-magnetic layer 322 is disposed on the reference layer 323. The non-magnetic layer 322 may be an electrically insulating material such as MgO for a tunnel junction sensing element, or an electrically conductive material such as Cu, Ag, or AgSn for a giant magnetoresistive sensing element. A free layer 324 is disposed on the non-magnetic layer 322. The free layer 324 is fabricated from a magnetic material, such as CoFe, CoFeB, NiFe, CoHf, CoFeBTa, or combinations thereof. The free layer 324 may be a single layer of magnetic material or multiple layers. A capping layer 326 is disposed on the free layer 324. The capping layer 326 is fabricated from Si, Ta, Ru, Hf, or combinations thereof. In some embodiments, the capping layer 326 includes multiple layers. The sensor shield S2 is disposed on the capping layer 326.

The high Hk insertion layer 314 includes a surface 328 at the MFS 202, the AP1 layer 316 includes a surface 330 at the MFS 202, the APC layer 318 includes a surface 332 at the MFS 202, the AP2 layer 320 includes a surface 334 at the MFS 202, the non-magnetic layer 322 includes a surface 336 at the MFS 202, and the free layer 324 includes a surface 338 at the MFS 202. The surfaces 328, 330, 332, 334, 336, 338 each have a width W1 in the cross-track direction, as indicated by the X-axis.

Figure 4A:
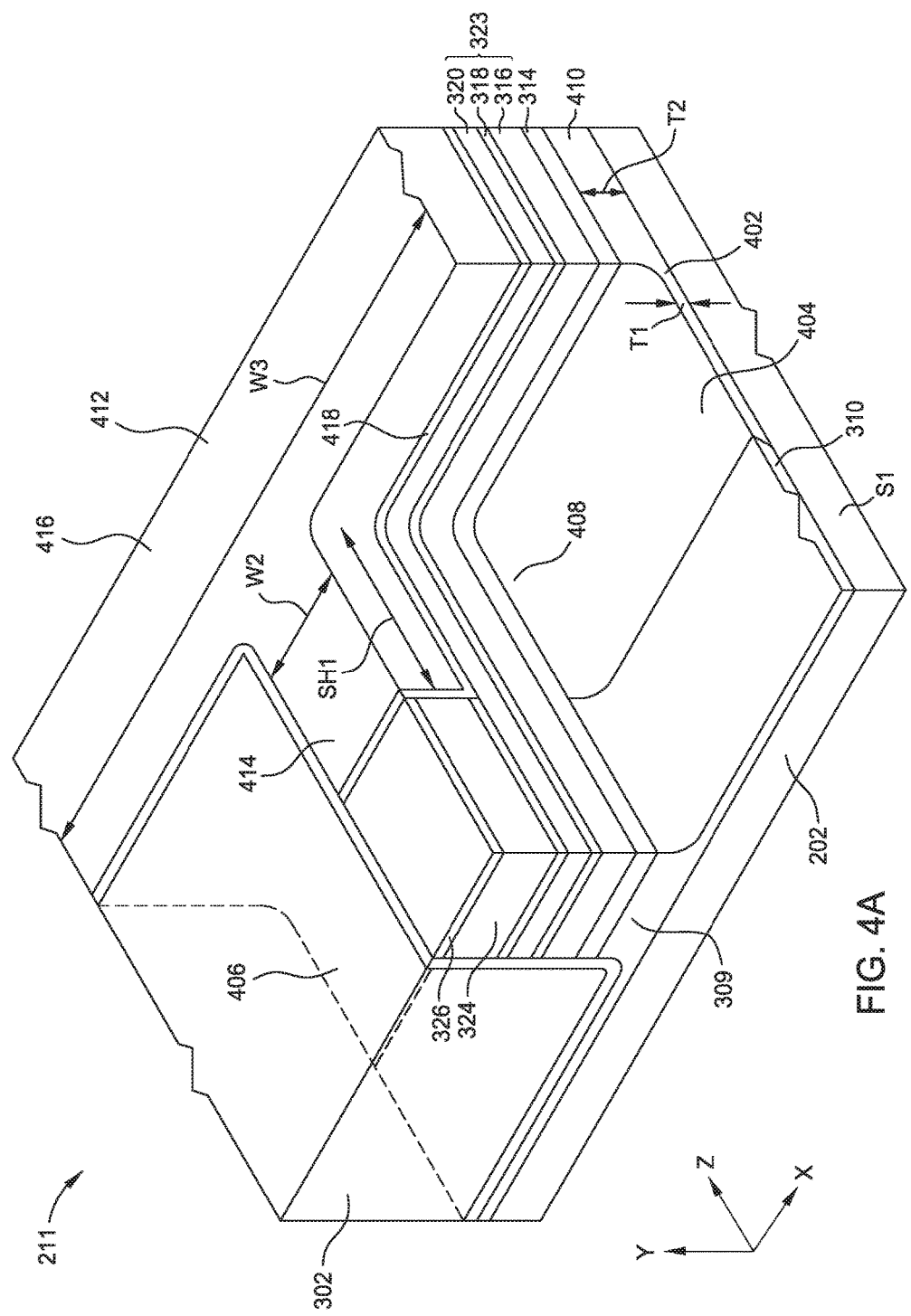
FIGS. 4A-4B are perspective views of a portion of the magnetic read head of FIG. 2 according to one embodiment.
Figure 4B:
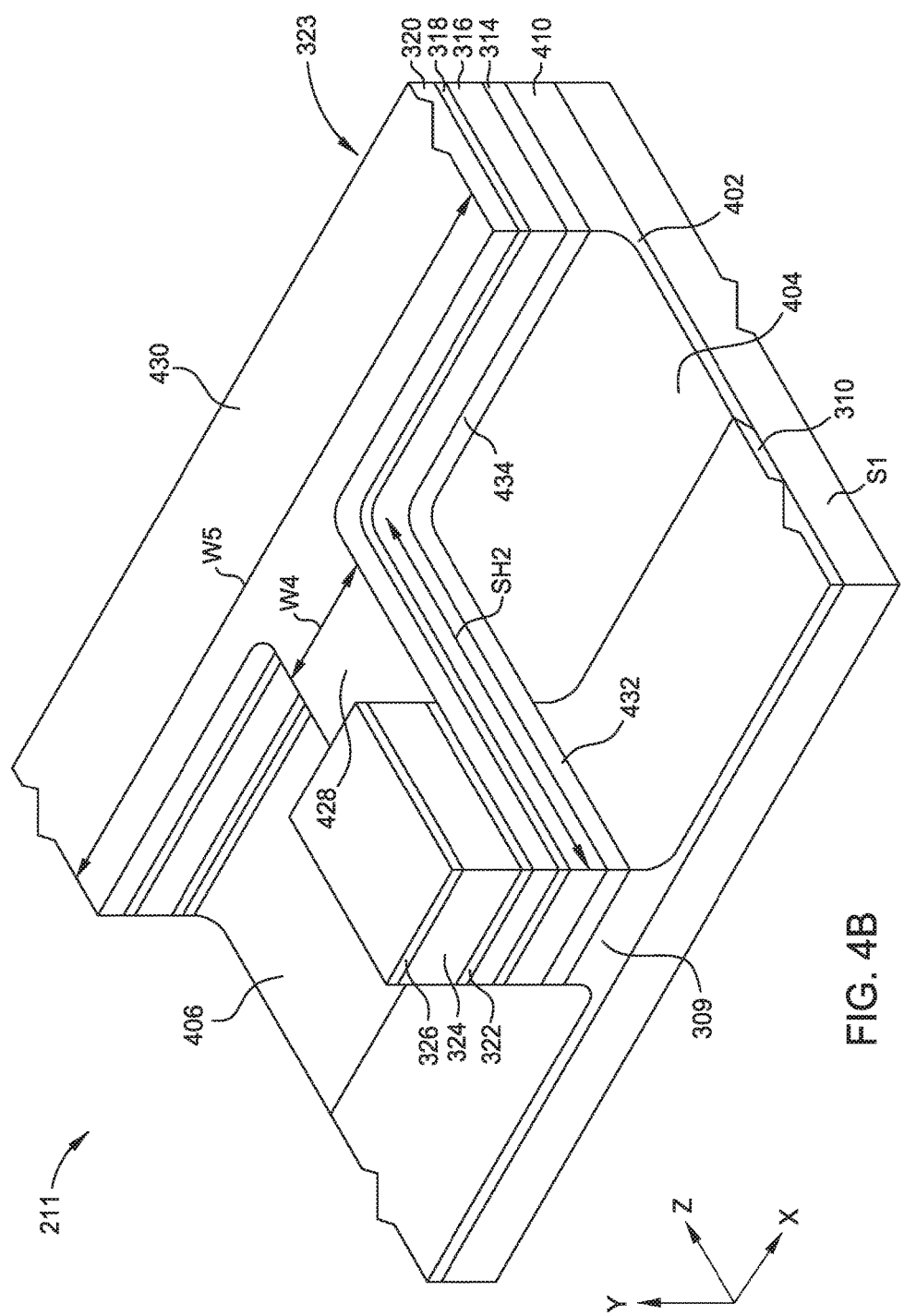

FIGS. 4A-4B are perspective views of a portion of the magnetic read head 211 of FIG. 2 according to one embodiment. The sensor shield S2, the second side shield 304, and the insulating layer 308 are omitted in FIG. 4A for better illustration. As shown in FIG. 4A, the magnetic read head 211 further includes an antiferromagnetic (AFM) layer 402 recessed from the MFS 202. The AFM layer 402 is fabricated from IrMn, PtMn, PtPdMn, NiMn, or IrMnCr. The AFM layer 402 includes a first portion 404, a second portion 406, a third portion 408, and a fourth portion 410. The third portion 408 is disposed between the first portion 404 and the second portion 406. The first portion 404, the second portion 406, and the third portion 408 all extend from the fourth portion 410 toward the MFS 202. The first portion 404, the second portion 406, and the third portion 408 are in contact with the shield structure 310. The third portion 408 of the AFM layer 402 is aligned with the portion 309 of the shield structure 310 in a stripe height direction, as indicated by the Z-axis. The insulating layer 306 is disposed on the shield structure 310 and the second portion 406 of the AFM layer 402, the insulating layer 308 (FIG. 3) is disposed on the shield structure 310 and the first portion 404 of the AFM layer 402, and the high Hk insertion layer 314 is disposed on the third portion 408 and the fourth portion 410 of the AFM layer 402. The first portion 404 and the second portion 406 of the AFM layer 402 each have a first thickness t1, and the third portion 408 and the fourth portion 410 of the AFM layer 402 each have a second thickness t2. The second thickness t2 is substantially greater than the first thickness t1.

The magnetic read head 211 further includes a thermally conductive structure 412 disposed over the reference layer 323, and an insulating layer 418 separating the thermally conductive structure 412 from the free layer 324 and the reference layer 323. The insulating layer 418 may be fabricated from the same material as the insulating layer 306. The thermally conductive structure 412 is recessed from the MFS 202. The thermally conductive structure 412 is fabricated from a good thermally conductive material, such as AlN, SiC, BeO, or h-(BN). In one embodiment, the thermally conductive structure 412 is fabricated from AlN, SiC, BeO, or h-(BN) laminated with good thermally conductive and high melting point metals such as W, Mo, Rh, Ir, Be or diamond like carbon (DLC) to improve thermal dissipation of heat during operation.

The thermally conductive structure 412 has a "T" shape such that a first portion 414 extends from the second portion 416 of the thermally conductive structure 412 towards the MFS 202. The first portion 414 of the thermally conductive structure 412 is recessed from the MFS 202 and has a stripe height SH1. The first portion 414 of the thermally conductive structure 412 is aligned with the third portion 408 of the AFM layer 402 in the down-track direction, as indicated by the Y-axis. The second portion 416 of the thermally conductive structure 412 is aligned with the fourth portion 410 of the AFM layer 402 in the down-track direction. The first portion 414 of the thermally conductive structure 412 is aligned with the free layer 324 in the stripe height direction. The first portion 414 has a width W2 in the cross-track direction, and the width W2 may be substantially the same as the width W1 (FIG. 3). The second portion 416 has a width W3 in the cross-track direction. The width W3 is substantially greater than the width W2 of the first portion 414. The thermally conductive structure 412 may be co-planar with the capping layer 326, and the sensor shield S2 (FIG. 3) is disposed on the thermally conductive structure 412 and the capping layer 326. In one embodiment, an insulating layer (not shown) is disposed on the thermally conductive structure 412, and the sensor shield S2 (FIG. 3) is disposed on the insulating layer.

The AFM layer 402 has an AFM pinning direction pointing away from the MFS 202, and the high Hk insertion layer 314 has an easy axis substantially perpendicular to the MFS 202. Thus, the combination of the Hk and the AFM induces enhanced unidirectional anisotropy in the AP1 layer 316 away from the MFS 202, inducing magnetization in the AP2 layer 320 towards the MFS 202, because the AP1 layer 316 is AP-coupled through the APC layer 318 to the AP2 layer 320. As a result, the reference layer 323 is self-pinned. Therefore, even though the AFM layer 402 is recessed from the MFS 202, the pinning strength to the reference layer 323 is not reduced due to the presence of the high Hk insertion layer 314. Furthermore, the thermally conductive structure 412 improves heat dissipation, leading to improved thermal stability.

FIG. 4B is a perspective view of a portion of the magnetic read head 211 of FIG. 2 according to one embodiment. The sensor shield S2, the first and second side shields 302, 304, and the first and second insulating layers 306, 308, and the thermally conductive structure 412 are omitted in FIG. 4B for better illustration. As shown in FIG. 4B, the reference layer 323 has a "T" shape such that a first portion 428 extends from a second portion 430 to the MFS 202. The first portion 428 is disposed at the MFS 202, and the first portion 428 has a stripe height SH2. The stripe height SH2 is substantially greater than the stripe height SH1 of the first portion 414 of the thermally conductive structure 412 (FIG. 4A). The first portion 428 of the reference layer 323 has a width W4 in the cross-track direction, and the width W4 may be substantially the same as the width W1 (FIG. 3). The second portion 430 of the reference layer 323 has a width W5 in the cross-track direction. The width W5 is substantially greater than the width W4. The width W5 is substantially the same as the width W3 of the second portion 416 of the thermally conductive structure 412 (FIG. 4A).

The first portion 428 of the reference layer 323 is aligned with the portion 309 of the shield structure 310 and the third portion 408 of the AFM layer 402 in the down-track direction. The first portion 428 of the reference layer 323 is also aligned with the first portion 414 of the thermally conductive structure 412 (FIG. 4A) in the down-track direction. The non-magnetic layer 322 and the first portion 414 of the AFM layer 402 are disposed on the first portion 428 of the reference layer 323. The non-magnetic layer 322 and the first portion 414 of the thermally conductive structure 412 (FIG. 4A) are aligned with the first portion 428 of the reference layer 323 in the down-track direction. The second portion 430 of the reference layer 323 is aligned with the fourth portion 410 of the AFM layer 402 in the down-track direction. The second portion 430 of the reference layer 323 is also aligned with the second portion 416 of the thermally conductive structure 412 (FIG. 4A) in the down-track direction.

The high Hk insertion layer 314 has a "T" shape such that a first portion 432 extends from a second portion 434 to the MFS 202. The first portion 432 is disposed at the MFS 202, and the first portion 432 has the stripe height SH2. The first portion 432 of the high Hk insertion layer 314 has the width W4 in the cross-track direction. The second portion 434 of the high Hk insertion layer 314 has the width W5 in the cross-track direction. The first portion 432 of the high Hk insertion layer 314 is aligned with the first portion 428 of the reference layer 323 in the down-track direction. The second portion 434 of the high Hk insertion layer 314 is aligned with the second portion 430 of the reference layer 323 in the down-track direction.

In summary, the magnetic read head utilizing the high Hk insertion layer and the "T" shaped thermally conductive structure has improved stability due to the improved pinning strength to the reference layer and improved heat dissipation.

In one non-limiting embodiment, a magnetic read head includes an antiferromagnetic layer recessed from a media facing surface, a reference layer disposed over the antiferromagnetic layer, a free layer disposed over the reference layer, and a thermally conductive structure recessed from the media facing surface. The thermally conductive structure includes a first portion and a second portion, the first portion extending from the second portion towards the media facing surface, and the first portion is aligned with the free layer in a stripe height direction.

In another non-limiting embodiment, the reference layer includes a first portion and a second portion, and the first portion extends from the second portion to the media facing surface.

In another non-limiting embodiment, the first portion of the thermally conductive structure is aligned with the first portion of the reference layer in a down-track direction.

In another non-limiting embodiment, the second portion of the thermally conductive structure is aligned with the second portion of the reference layer in the down-track direction.

In another non-limiting embodiment, the thermally conductive structure includes AlN, SiC, BeO, or h-(BN).

In another non-limiting embodiment, the thermally conductive structure includes AlN, SiC, BeO, or h-(BN) laminated with W, Mo, Rh, Ir, Be or diamond like carbon.

In another non-limiting embodiment, a data storage device includes the magnetic read head.

In another non-limiting embodiment, a magnetic read head includes an antiferromagnetic layer recessed from a media facing surface, a reference layer disposed over the antiferromagnetic layer, a free layer disposed over the reference layer, and a thermally conductive structure recessed from the media facing surface. The thermally conductive structure includes a first portion and a second portion, the first portion extending from the second portion towards the media facing surface, and the first portion has a first width, the second portion has a second width, and the second width is substantially greater than the first width.

In another non-limiting embodiment, the magnetic read head further includes a non-magnetic layer disposed between the reference layer and the free layer.

In another non-limiting embodiment, the non-magnetic layer comprises MgO, Cu, Ag, or AgSn.

In another non-limiting embodiment, the magnetic read head further includes a capping layer disposed on the free layer.

In another non-limiting embodiment, the capping layer includes Si, Ta, Ru, Hf, or combinations thereof.

In another non-limiting embodiment, the magnetic read head further includes a first ferromagnetic shield and a second ferromagnetic shield, and the reference layer, the non-magnetic layer, the free layer, and the capping layer are disposed between the first ferromagnetic shield and the second ferromagnetic shield.

In another non-limiting embodiment, the magnetic read head further includes a shield structure disposed on the first ferromagnetic shield.

In another non-limiting embodiment, a magnetic read head includes an antiferromagnetic layer recessed from a media facing surface, and the antiferromagnetic layer includes a first portion, a second portion, a third portion, and a fourth portion. The third portion is between the first portion and the second portion. The magnetic read head further includes a reference layer disposed over the antiferromagnetic layer, a free layer disposed over the reference layer, and a thermally conductive structure recessed from the media facing surface. The thermally conductive structure includes a first portion and a second portion, the first portion extending from the second portion towards the media facing surface, the first portion of the thermally conductive structure is aligned with the third portion of the antiferromagnetic layer in a down-track direction, and the second portion of the thermally conductive structure is aligned with the fourth portion of the antiferromagnetic layer in the down-track direction.

In another non-limiting embodiment, the first portion, second portion, and third portion of the antiferromagnetic layer extend from the fourth portion toward the media facing surface.

In another non-limiting embodiment, the first portion and the second portion of the antiferromagnetic layer each have a first thickness, the third portion and the fourth portion of the antiferromagnetic layer each have a second thickness, wherein the second thickness is substantially greater than the first thickness.

In another non-limiting embodiment, a magnetic read head includes an antiferromagnetic layer recessed from a media facing surface, and a high Hk insertion layer disposed on the antiferromagnetic layer. The high Hk insertion layer includes a first portion having a first width and a second portion having a second width substantially greater than the first width, and the first portion extends from the second portion to the media facing surface. The magnetic recording head further includes a reference layer disposed over the high Hk insertion layer, a free layer disposed over the reference layer, and a thermally conductive structure recessed from the media facing surface. The thermally conductive structure includes a first portion and a second portion, the first portion extending from the second portion towards the media facing surface, and the first portion of the thermally conductive structure is aligned with the first portion of the high Hk insertion layer in a down-track direction.

In another non-limiting embodiment, the reference layer includes a first ferromagnetic layer, a second ferromagnetic layer, and an AP coupling layer disposed between the first ferromagnetic layer and the second ferromagnetic layer.

In another non-limiting embodiment, the AP coupling layer includes Ru, Ir, Rh, Cr or alloys thereof.

In another non-limiting embodiment, the free layer includes CoFe, CoFeB, NiFe, CoHf, CoFeTaB, or combinations thereof.

In another non-limiting embodiment, the antiferromagnetic layer includes IrMn, PtMn, PtPdMn, NiMn, IrMnCr, or combinations thereof.

In another non-limiting embodiment, the high Hk insertion layer includes FeCo, FeNiCo, Co, NiFe, NiFeCr, or the combination thereof.

In another non-limiting embodiment, a magnetic read head includes an antiferromagnetic layer recessed from a media facing surface, a reference layer disposed over the antiferromagnetic layer, a free layer disposed over the reference layer, and means for dissipating heat disposed on the reference layer. The means for dissipating heat includes a first portion and a second portion, the first portion extending from the second portion towards the media facing surface, and the first portion is aligned with the free layer in a stripe height direction.

In another non-limiting embodiment, the magnetic read head further includes a first ferromagnetic shield, a shield structure disposed on the first ferromagnetic shield, and a non-magnetic layer disposed between the reference layer and the free layer.

In another non-limiting embodiment, the antiferromagnetic layer includes a first portion, a second portion, a third portion disposed between the first and second portions, and a fourth portion, wherein the first portion, the second portion, and the third portion extend from the fourth portion toward the media facing surface.

While the foregoing is directed to embodiments of the present disclosure, other and further embodiments of the disclosure may be devised without departing from the basic scope thereof, and the scope thereof is determined by the claims that follow.

What is claimed is:

1. A magnetic read head, comprising:
an antiferromagnetic layer recessed from a media facing surface;
a reference layer disposed over the antiferromagnetic layer;
a free layer disposed over the reference layer; and
a thermally conductive structure recessed from the media facing surface, wherein the thermally conductive structure includes a first portion and a second portion, the first portion extending from the second portion towards the media facing surface, and the first portion is aligned with the free layer in a stripe height direction.

2. The magnetic read head of claim 1, wherein the reference layer comprises a first portion and a second portion, wherein the first portion extends from the second portion to the media facing surface.

3. The magnetic read head of claim 2, wherein the first portion of the thermally conductive structure is aligned with the first portion of the reference layer in a down-track direction.

4. The magnetic read head of claim 3, wherein the second portion of the thermally conductive structure is aligned with the second portion of the reference layer in the down-track direction.

5. The magnetic read head of claim 1, wherein the thermally conductive structure comprises AlN, SiC, BeO, or h-(BN).

6. The magnetic read head of claim 1, wherein the thermally conductive structure comprises AlN, SiC, BeO, or h-(BN) laminated with W, Mo, Rh, Ir, Be, or diamond like carbon.

7. A data storage device comprising the magnetic read head of claim 1.

8. A magnetic read head, comprising:
an antiferromagnetic layer recessed from a media facing surface;
a reference layer disposed over the antiferromagnetic layer;
a free layer disposed over the reference layer; and
a thermally conductive structure recessed from the media facing surface, wherein the thermally conductive structure includes a first portion and a second portion, the first portion extending from the second portion towards the media facing surface, wherein the first portion has a first width, the second portion has a second width, and the second width is substantially greater than the first width.

9. The magnetic read head of claim 8, further comprising a non-magnetic layer disposed between the reference layer and the free layer.

10. The magnetic read head of claim 9, wherein the non-magnetic layer comprises MgO, Cu, Ag, or AgSn.

11. The magnetic read head of claim 9, further comprising a capping layer disposed on the free layer.

12. The magnetic read head of claim 11, wherein the capping layer comprises Si, Ta, Ru, Hf, or combinations thereof.

13. The magnetic read head of claim 11, further comprising a first ferromagnetic shield and a second ferromagnetic shield, wherein the reference layer, the non-magnetic layer, the free layer, and the capping layer are disposed between the first ferromagnetic shield and the second ferromagnetic shield.

14. The magnetic read head of claim 13, further comprising a shield structure disposed on the first ferromagnetic shield.

15. A data storage device comprising the magnetic read head of claim 8.

16. A magnetic read head, comprising:
an antiferromagnetic layer recessed from a media facing surface, wherein the antiferromagnetic layer includes a first portion, a second portion, a third portion, and a fourth portion, wherein the third portion is between the first portion and the second portion;
a reference layer disposed over the antiferromagnetic layer;
a free layer disposed over the reference layer; and
a thermally conductive structure recessed from the media facing surface, wherein the thermally conductive structure includes a first portion and a second portion, the first portion extending from the second portion towards the media facing surface, wherein the first portion of the thermally conductive structure is aligned with the third portion of the antiferromagnetic layer in a down-track direction, and the second portion of the thermally conductive structure is aligned with the fourth portion of the antiferromagnetic layer in the down-track direction.

17. The magnetic read head of claim 16, wherein the first portion, second portion, and third portion of the antiferromagnetic layer extend from the fourth portion toward the media facing surface.

18. The magnetic read head of claim 17, wherein the first portion and the second portion of the antiferromagnetic layer each have a first thickness, the third portion and the fourth portion of the antiferromagnetic layer each have a second thickness, wherein the second thickness is substantially greater than the first thickness.

19. A data storage device comprising the magnetic read head of claim 16.

20. A magnetic read head, comprising:
an antiferromagnetic layer recessed from a media facing surface;
a high Hk insertion layer disposed on the antiferromagnetic layer, wherein the high Hk insertion layer includes a first portion having a first width and a second portion having a second width substantially greater than the first width, and the first portion extends from the second portion to the media facing surface;
a reference layer disposed over the high Hk insertion layer;
a free layer disposed over the reference layer; and
a thermally conductive structure recessed from the media facing surface, wherein the thermally conductive structure includes a first portion and a second portion, the first portion extending from the second portion towards the media facing surface, and the first portion of the thermally conductive structure is aligned with the first portion of the high Hk insertion layer in a down-track direction.

21. The magnetic read head of claim 20, wherein the reference layer comprises a first ferromagnetic layer, a second ferromagnetic layer, and an AP coupling layer disposed between the first ferromagnetic layer and the second ferromagnetic layer.

22. The magnetic read head of claim 21, wherein the AP coupling layer comprises Ru, Ir, Rh, Cr or alloys thereof.

23. The magnetic read head of claim 20, wherein the free layer comprises CoFe, CoFeB, NiFe, CoHf, CoFeTaB, or combinations thereof.

24. The magnetic read head of claim 20, wherein the antiferromagnetic layer comprises IrMn, PtMn, PtPdMn, NiMn, IrMnCr, or combinations thereof.

25. The magnetic read head of claim 20, wherein the high Hk insertion layer comprises FeCo, FeNiCo, Co, NiFe, NiFeCr, or the combination thereof.

26. A data storage device comprising the magnetic read head of claim 20.

27. A magnetic read head, comprising:
an antiferromagnetic layer recessed from a media facing surface;
a reference layer disposed over the antiferromagnetic layer;
a free layer disposed over the reference layer; and
means for dissipating heat disposed on the reference layer, wherein the means for dissipating heat includes a first portion and a second portion, the first portion extending from the second portion towards the media facing surface, and the first portion is aligned with the free layer in a stripe height direction.

28. The magnetic read head of claim 27, further comprising:
a first ferromagnetic shield;
a shield structure disposed on the first ferromagnetic shield; and
a non-magnetic layer disposed between the reference layer and the free layer.

29. The magnetic read head of claim 28, wherein the antiferromagnetic layer comprises a first portion, a second portion, a third portion disposed between the first and second portions, and a fourth portion, wherein the first portion, the second portion, and the third portion extend from the fourth portion toward the media facing surface.

30. A data storage device comprising the magnetic read head of claim 27.

* * * * *